United States Patent
Huang

(10) Patent No.: US 8,526,244 B2
(45) Date of Patent: Sep. 3, 2013

(54) ANTI-FUSE CIRCUIT

(75) Inventor: Ming-Chien Huang, New Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 264 days.

(21) Appl. No.: 13/187,533

(22) Filed: Jul. 21, 2011

(65) Prior Publication Data

US 2013/0021854 A1    Jan. 24, 2013

(51) Int. Cl.
*G11C 7/06*    (2006.01)
(52) U.S. Cl.
USPC .......... 365/189.07; 365/189.011; 365/189.05; 365/189.12; 365/225.7
(58) Field of Classification Search
USPC .......... 365/189.07, 189.011, 189.05, 189.12, 365/225.7
See application file for complete search history.

(56) References Cited

U.S. PATENT DOCUMENTS

| 5,966,028 A | 10/1999 | Apland |
| 7,339,848 B1 | 3/2008 | Stansell et al. |
| 8,391,091 B2 * | 3/2013 | Chang et al. .................. 365/201 |
| 2011/0080765 A1 * | 4/2011 | Groepl et al. .................. 365/96 |

* cited by examiner

*Primary Examiner* — Toan Le
(74) *Attorney, Agent, or Firm* — Jianq Chyun IP Office

(57) ABSTRACT

An anti-fuse circuit including a programmable module, a read module, and a control module is provided. The programmable module has a plurality of data cells. The read module is coupled to the programmable module. During a normal operation, the read module distinguishes which one or more of the data cells are stressed. The control module is coupled to the programmable module. During a stress operation, the control module controls each stressed data cell to be coupled to a high voltage, a low voltage, and a control voltage. The first end of each stressed data cells is coupled to the low voltage, the second end of each stressed data cells is coupled to the high voltage, and the control end of each stressed data cells is coupled to the control voltage during the stress operation.

17 Claims, 5 Drawing Sheets

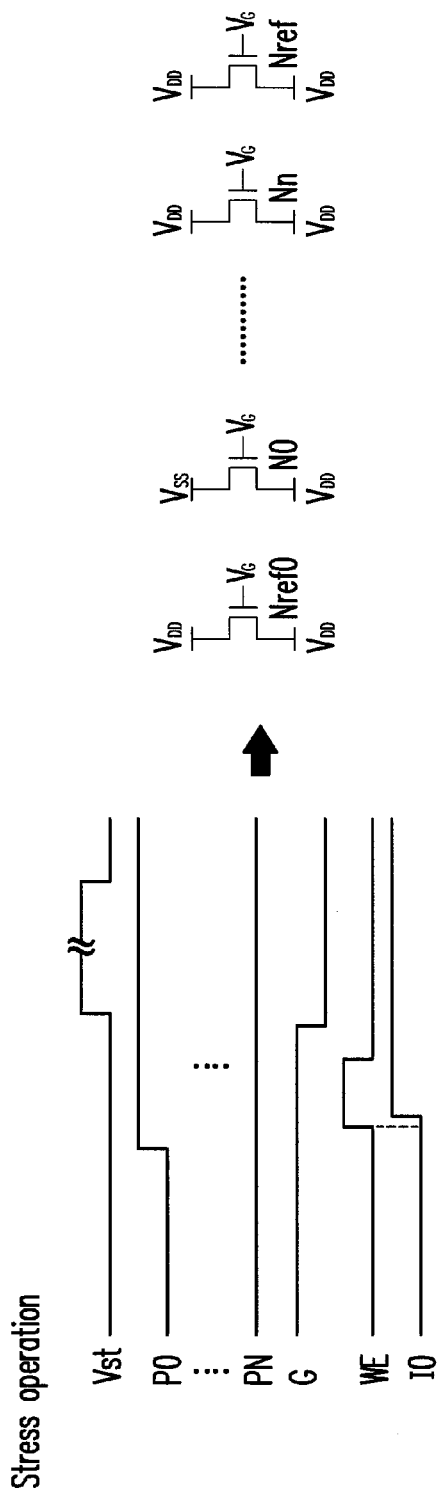

US 8,526,244 B2

ANTI-FUSE CIRCUIT

BACKGROUND OF THE INVENTION

1. Field of the Invention

The invention relates to an electrical circuit, and more particularly to an anti-fuse circuit.

2. Description of Related Art

An anti-fuse is an electrical device that performs the opposite function to a fuse. Whereas a fuse starts with a low resistance and is designed to permanently break an electrically conductive path (typically when the current through the path exceeds a specified limit), an anti-fuse starts with a high resistance and is designed to permanently create an electrically conductive path (typically when the voltage across the anti-fuse exceeds a certain level). This technology has many applications.

However, for conventional applications, the manufacturing cost of anti-fuse circuit in high voltage process is too expensive. Therefore, a suitable anti-fuse circuit with low manufacturing cost is necessary for business applications.

SUMMARY OF THE INVENTION

Accordingly, the invention is directed to an anti-fuse circuit in dual oxide process instead of the conventional high voltage process for saving manufacturing cost.

The invention provides an anti-fuse circuit including a programmable module, a read module, and a control module. The programmable module is coupled to a high voltage, a low voltage, and a control voltage and includes a plurality of data cells. Each of the data cells has a first end, a second end, and a control end. The read module is coupled to the programmable module. During a normal operation, the read module distinguishes which one or more of the data cells are stressed. The control module is coupled to the programmable module. During a stress operation, the control module controls each stressed data cell to be coupled to the high voltage, the low voltage, and the control voltage. The first end of each stressed data cell is coupled to the low voltage, the second end of each stressed data cell is coupled to the high voltage, and the control end of each stressed data cell is coupled to the control voltage thereof the device presents a reverse stress condition during the stress operation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A shows waveforms of signals in FIG. 2A and FIG. 2B during the stress operation according to an exemplary embodiment of the invention.

FIG. 4B shows the configuration of data cells during the stress operation.

DESCRIPTION OF EMBODIMENTS

Figure 1:
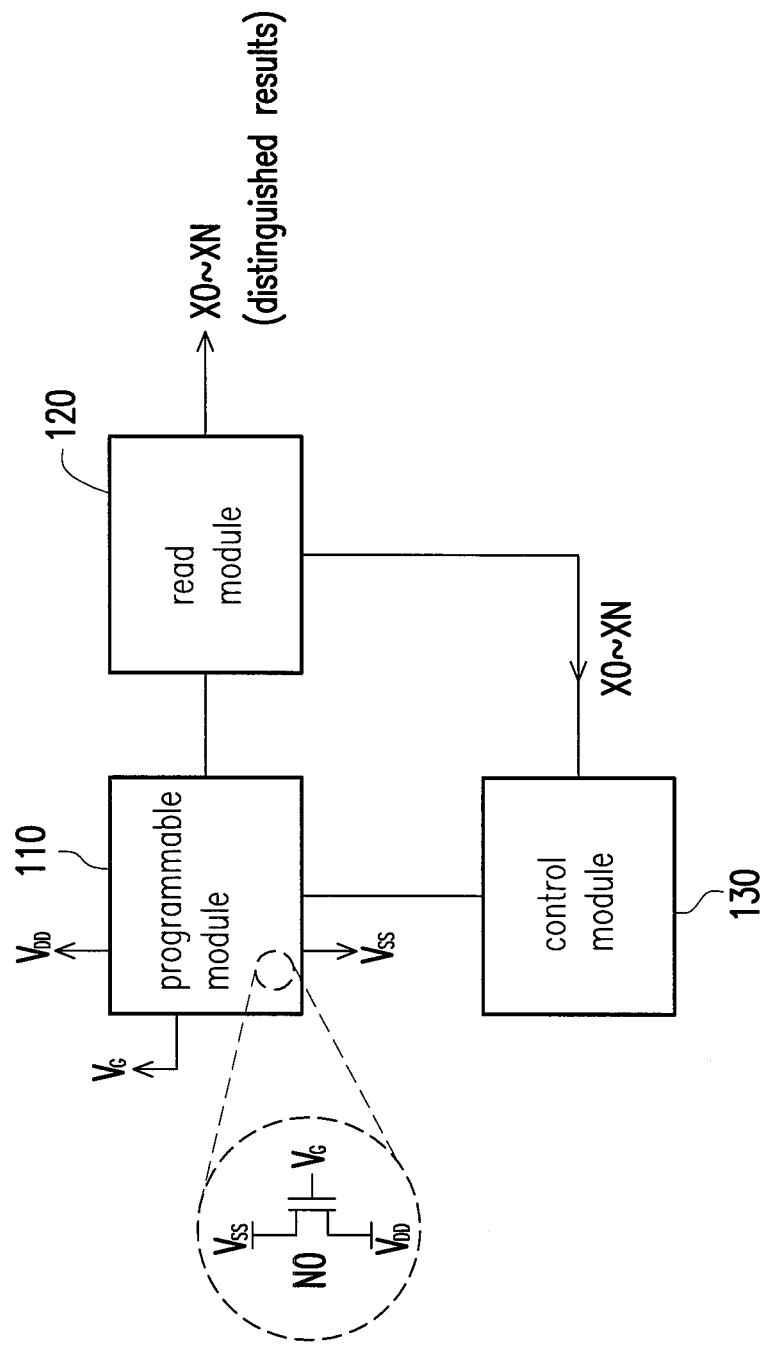
FIG. 1 is a block diagram of an anti-fuse circuit according to an exemplary embodiment of the invention.

FIG. 1 is a block diagram of an anti-fuse circuit according to an exemplary embodiment of the invention. Referring to FIG. 1, the anti-fuse circuit 100 of the present embodiment includes a programmable module 110, a read module 120, and a control module 130.

Figure 2A:
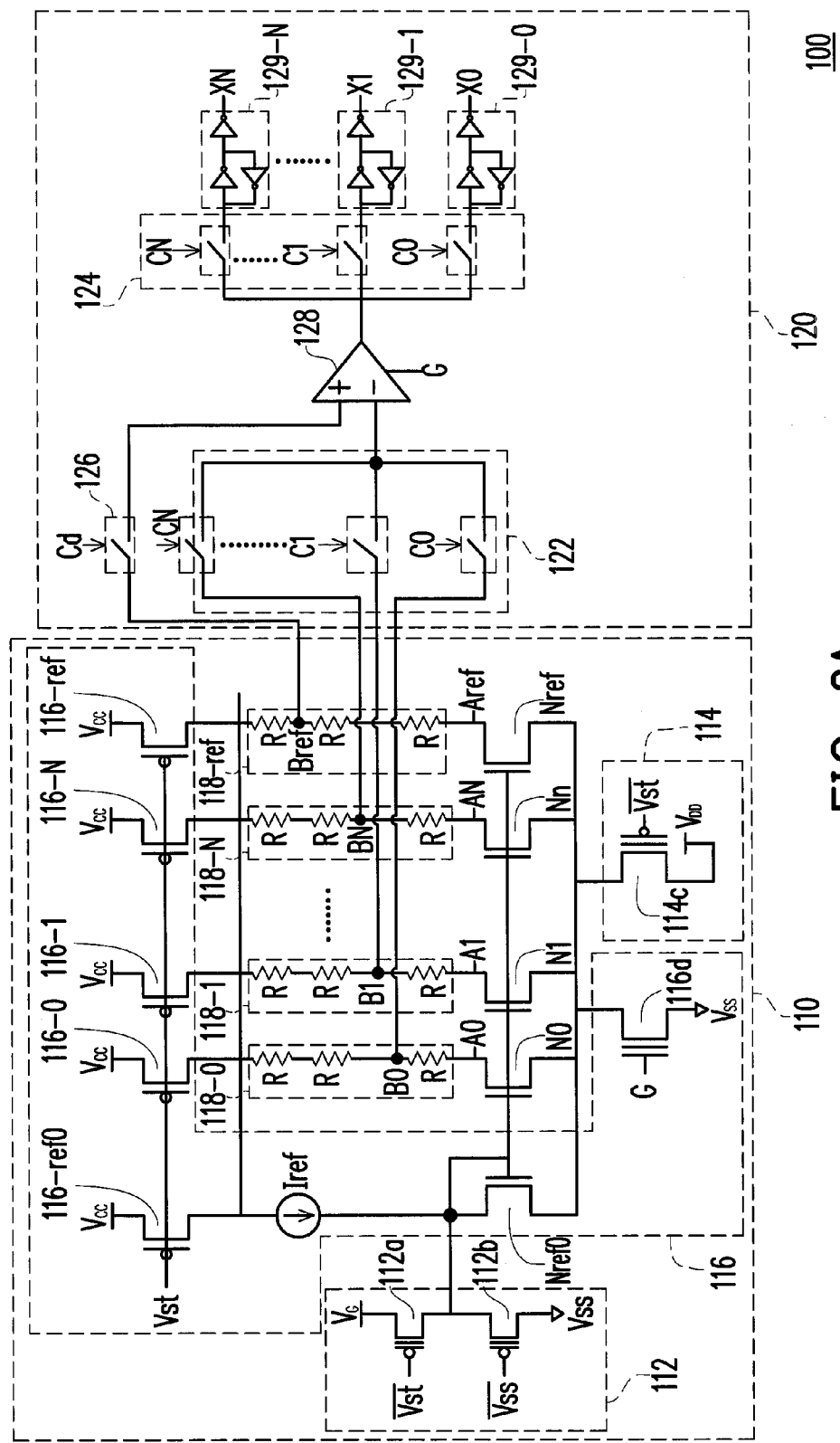
FIG. 2A shows circuit diagrams of the programmable module and the read module in FIG. 1 according to an exemplary embodiment of the invention.

The programmable module 110 is coupled to a high voltage $V_{DD}$, a low voltage $V_{SS}$, and a control voltage $V_G$. The programmable module 110 includes a plurality of data cells N0 to Nn and Nref as shown in FIG. 2A, wherein the data cell Nref serves as a reference cell, and the data cells N0 to Nn and Nref include anti-fuse devices. The read module 120 is coupled to the programmable module 110. During a normal operation, the read module 120 distinguishes which one or more of the data cells N0 to Nn are stressed and accordingly outputs distinguished results X0 to XN to a next stage and the control module 130. The control module 130 is coupled to the programmable module 110. During a stress operation, the control module 130 controls the stressed data cell(s), e.g. the data cell N0, to be coupled to the high voltage $V_{DD}$, the low voltage $V_{SS}$, and the control voltage $V_G$ according to the distinguished results X0 to XN. If a data cell is stressed, the threshold voltage thereof would become higher.

In the present embodiment, the stressed data cell N0 is a thin NMOS for example, the first end, the second end, and the control end of the stressed data cell N0 are respectively the source end, the drain end, and the gate end. The source end of the stressed data cell N0 is coupled to the low voltage $V_{SS}$, the drain end of the stressed data cell N0 is coupled to the high voltage $V_{DD}$, and the gate end of the stressed data cell N0 is coupled to the control voltage $V_G$ during the stress operation. In such a case, hot carriers of the stressed data cell N0 are reversed for reducing stress time during the stress operation. Herein, the value of the control voltage $V_G$ is half of the high voltage $V_{DD}$ (i.e. $V_{DD}/2$) for example, and the invention is not limited thereto.

Figure 2B:
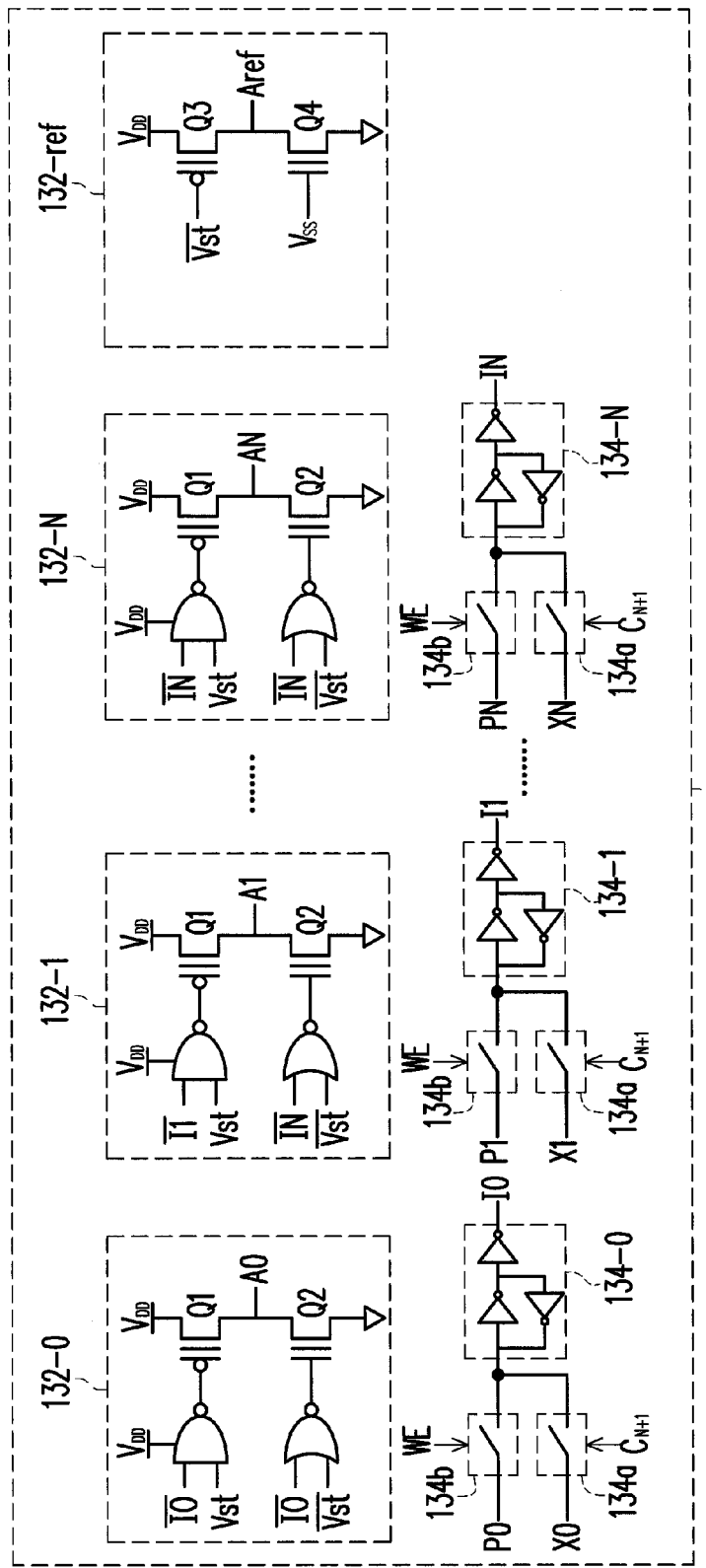
FIG. 2B shows a circuit diagram of the control module in FIG. 1 according to an exemplary embodiment of the invention.

Specifically, FIG. 2A shows circuit diagrams of the programmable module and the read module in FIG. 1 according to an exemplary embodiment of the invention. FIG. 2B shows a circuit diagram of the control module in FIG. 1 according to an exemplary embodiment of the invention.

Referring to FIG. 2A, the programmable module 110 of the present embodiment includes the data cells N0 to Nn and Nref, a first reverse unit 112, a second reverse unit 114, a plurality of current sources 116, and a plurality of resistor sets 118-0 to 118-N and 118-ref. The first reverse unit 112 is coupled to the control end of the data cells N0 to Nn and Nref and provides the control voltage $V_G$ to the control end(s) of the stressed data cell(s) during the stress operation. The second reverse unit 114 is coupled to the second ends of the data cells N0 to Nn and Nref and provides the high voltage $V_{DD}$ to the second end(s) of the stressed data cell(s) during the stress operation.

The first reverse unit 112 includes a first switch 112a and a second switch 112b. The first switch 112a has a first end, a second end, and a control end. The first end of the first switch 112a is coupled to the control voltage $V_G$, the second end of the first switch 112a is coupled to the control ends of the data cells N0 to Nn and Nref, and the control end of the first switch 112a is coupled to an inverted stress voltage $\overline{Vst}$. The second switch 112b has a first end, a second end, and a control end. The first end of the second switch 112b is coupled to the second end of the first switch 112a, and the second end and the control end of the second switch 112b are coupled to the low voltage $V_{SS}$. The second reverse unit 114 includes a third switch 114c. The third switch 114c has a first end, a second end, and a control end. The first end of the third switch 114c is coupled to the second ends of the data cells N0 to Nn and Nref, the second end of the third switch 114c is coupled to the high voltage $V_{DD}$, and the control end of the third switch 114c is coupled to an inverted stress voltage $\overline{Vst}$.

In an embodiment of the present invention, each of the data cells N0 to Nn and Nref may be a thin oxide NMOS of which oxide layer is about 36 angstroms, the second switch 112b may be thick oxide NMOS of which oxide layer is about 60 angstroms, and the first switch 112a and the third switch 114c may be thick oxide PMOS of which oxide layer is about 60 angstroms.

The current sources 116 are controlled by a stress voltage Vst and include a plurality of current mirrors. For the data cell N0, the transistors 116-ref0, 116-0, Nref0, and 116d serve as a set of current mirror providing a current Iref, for example, for the data cell N0 through the resistor set 118-0. Similarly, for other data cells N1 to Nn and Nref, the current Iref is provided by corresponding sets of current mirrors. The resistor sets 118-0 to 118-N and 118-ref are respectively coupled between the data cells N0 to Nn and Nref and the current sources 116. The stress voltage Vst and the inverted stress voltage $\overline{Vst}$ are complementary to each other. Each of the resistor sets 118-0 to 118-N and 118-ref includes a plurality of resistors R which are coupled in series, and three resistors R in each of the resistor sets are exemplary herein. The data cells N0 to Nn and Nref are respectively biased by the current sources 116 through the corresponding resistor sets. For example, the data cell N0 is biased by the current sources 116 through the resistor set 118-0, and the reference cell Nref is biased by the current sources 116 through the resistor set 118-ref.

Referring to FIG. 2A again, the read module 120 of the present embodiment includes a first selection unit 122, a second selection unit 124, a dummy switch 126, a comparator 128, and a plurality of first latch units 129-0 to 129-N. The read module 120 has a first input end and a plurality of second input ends. The first input end of the read module 120 is coupled to the first end of the reference cell Nref through the resistor set 118-ref. The second input ends of the read module 120 are respectively coupled to the first ends of the data cells N0 to Nn through the resistor sets 118-0 to 118-N.

In detail, the dummy switch 126 is controlled by a signal Cd and has a first end and a second end, and the first end thereof serves as the first input end of the read module 120. The first end of the dummy switch 126 is coupled to the first end of the reference cell Nref through two resistors R in the resistor set 118-ref. The first selection unit 122 has a plurality of first ends and a second end, and the first ends of the first selection unit 122 serve as the second input ends of the read module 120. The first ends of the first selection unit 122 are correspondingly coupled to the first ends of the data cells N0 to Nn through one resistor R in the resistor sets 118-0 to 118-N, respectively. Accordingly, if none of the data cells N0 to Nn is stressed, the voltage of the first end of the dummy switch 126, i.e. the voltage of the first input end of the read module 120, is higher than the voltages of the first ends of the first selection unit 122, i.e. the voltages of the second input ends of the read module 120. The comparator 128 is enabled by a signal G and has a first input end (+), a second input end (−), and an output end. The first input end of the comparator 128 is coupled to the second end of the dummy switch 126, and the second input end of the comparator 128 is coupled to the second end of the first selection unit 122. When distinguishing which data cells are stressed, the comparator 128 outputs different distinguished results according to the status of the distinguished data cells. If the distinguished data cells are stressed, the comparator 128 outputs the distinguished results with a high level, such as logic 1. By contrast, if the distinguished data cells are unstressed, the comparator 128 outputs the distinguished results with a low level, such as logic 0. The second selection unit 124 has a first end and a plurality of second ends. The first end of the second selection unit 124 is coupled to the output end of the comparator 128, and the second ends of the second selection unit 124 are coupled to the first latch units 129-0 to 129-N. The first selection unit 122 and the second selection unit 124 select the data cells N0 to Nn to be distinguished according to a plurality of first selecting signals C0 to CN.

In such a configuration, the read module 120 distinguishes which one or more of the data cells N0 to Nn are stressed according to the first selecting signals C0 to CN, and the distinguished results X0 to XN are respectively latched by the first latch units 129-0 to 129-N. For example, if the data cell N0 is stressed, it would be distinguished by the read module 120, and the distinguished result X0 may show a logical symbol 1 referring to a high voltage.

Referring to FIG. 2B, the control module 130 of the present embodiment includes a plurality of control units 132-0 to 132-N and 132-ref and a plurality of second latch units 134-0 to 134-N and 134-ref. The control units 132-0 to 132-N corresponding to the data cells N0 to Nn provide data voltages A0 to AN to the first ends of the data cells N0 to Nn during the stress operation according to the distinguished results X0 to XN of the read module 120. Each of the data voltages A0 to AN could be either the high voltage $V_{DD}$ or the low voltage $V_{SS}$, and the voltage levels of the data voltages A0 to AN are based on the distinguished results X0 to XN. In the present embodiment, the configuration of the control units 132-0 to 132-N is different from that of the control unit 132-ref corresponding to the reference cell Nref.

In detail, each of the control units 132-0 to 132-N includes a fourth switch Q1, a fifth switch Q2, a NAND gate, and a NOR gate. The fourth switch Q1 has a first end, a second end, and a control end. The first end of the fourth switch Q1 is coupled to the high voltage $V_{DD}$, and the second end of the fourth switch Q1 is coupled to the first end of the corresponding data cell. For example, the second end of the fourth switch Q1 in the control unit 132-0 is coupled to the first end of the data cell N0. The fifth switch Q2 has a first end, a second end, and a control end. The first end of the fifth switch Q2 is coupled to the second end of the fourth switch Q1, and the second end of the fifth switch Q2 is coupled to the low voltage $V_{SS}$. The NAND gate has a first input end, a second input end, and an output end. The first input end of the NAND gate correspondingly receives the distinguished results X0 to XN, the second input end of the NAND gate receives the stress voltage Vst, and the output end of the NAND gate is coupled to the control end of the fourth switch Q1. The NOR gate has a first input end, a second input end, and an output end. The first input end of the NOR gate correspondingly receives the distinguished results X0 to XN, the second input end of the NOR gate receives the inverted stress voltage $\overline{Vst}$, and the output end of the NOR gate is coupled to the control end of the fifth switch Q2.

On the other hand, the control unit 132-ref corresponding to the reference cell Nref includes a sixth switch Q3 and a seventh switch Q4. The sixth switch Q3 has a first end, a second end, and a control end. The first end of the sixth switch Q3 is coupled to the high voltage $V_{DD}$, the second end of the sixth switch Q3 is coupled to the first end of the reference cell Nref, and the control end of the sixth switch Q3 is coupled to the inverted stress voltage $\overline{Vst}$. The seventh switch Q4 has a first end, a second end, and a control end. The first end of the seventh switch Q4 is coupled to the second end of the sixth switch Q3, and the second end and the control end of the seventh switch Q4 are coupled to the low voltage $V_{SS}$.

The second latch units 134-0 to 134-N are respectively coupled to the control units 132-0 to 132-N. The second latch units 134-0 to 134-N latch the distinguished results X0 to XN from the read module 120 while the switches 134a are turned on by a second selecting signal $C_{N+1}$ and respectively output the distinguished results I0 to IN to the control units 132-0 to 132-N. Furthermore, once the anti-fuse circuit 100 executes the stress operation, a write enable signal WE turn on the switches 134b, and the second latch units 134-0 to 134-N latch a set of program signals P0 to PN. By contrast, the switches 134a are turned off in the meanwhile.

Figure 3:
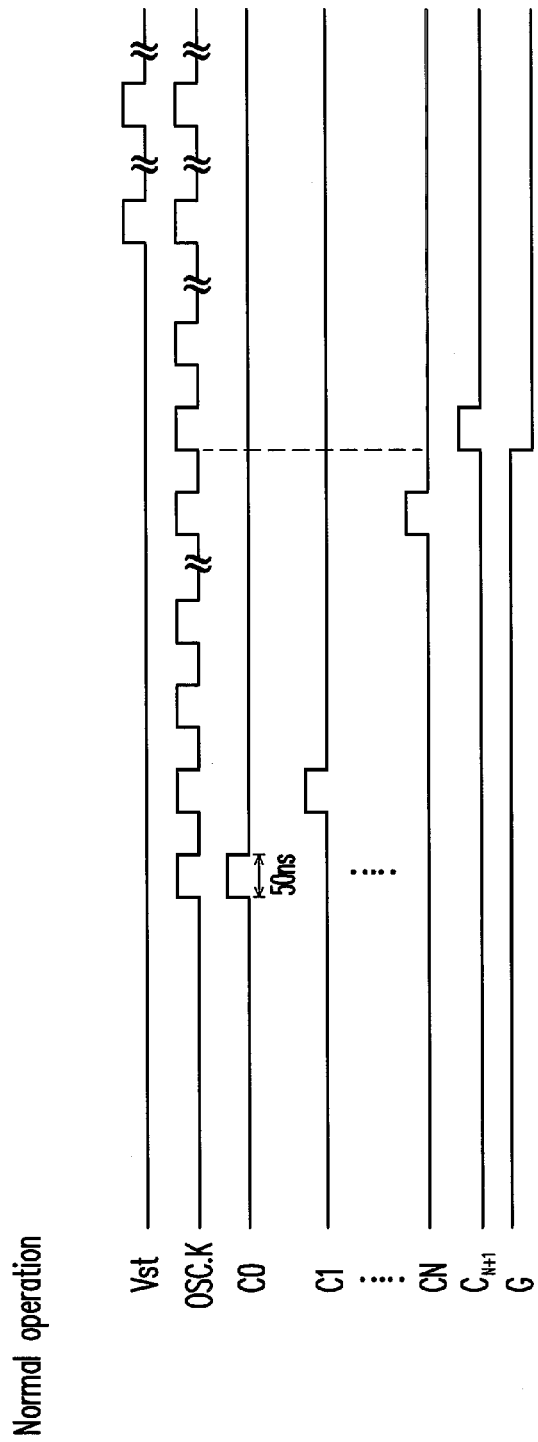
FIG. 3 shows waveforms of signals in FIG. 2A and FIG. 2B during the normal operation according to an exemplary embodiment of the invention.

FIG. 3 shows waveforms of signals in FIG. 2A and FIG. 2B during the normal operation according to an exemplary embodiment of the invention. Referring to FIG. 2A, FIG. 2B, and FIG. 3, a system clock OSC.K is provided for the anti-fuse circuit 100. During the normal operation, the first selecting signals C0 to CN are sequentially enabled for a short time about 50 nanoseconds in accordance with the system clock OSC.K. The signal G stays in a high level at the same time, and the transistor 116d is turned on. The first ends and the second ends, such as source ends and drain ends respectively, of the data cells N0 to Nn and Nref are coupled to the high voltage $V_{DD}$. Accordingly, the comparator 128 sequentially compares voltages of nodes B0 to BN with a voltage of a node Bref to distinguish which one or more of the data cells N0 to Nn are stressed, and the distinguished results X0 to XN are respectively latched by the first latch units 129-0 to 129-N. Next, the signal G goes from high to low, and the second selecting signal $C_{N+1}$ is enabled in the meanwhile, such that the distinguished results X0 to XN are further latched in the second latch units 134-0 to 134-N of the control module 130, respectively. Therefore, specific data cells would be re-stressed according to the distinguished results I0 to IN while the stress voltage Vst and the system clock OSC.K go to high after all of the distinguished results X0 to XN are latched.

FIG. 4A shows waveforms of signals in FIG. 2A and FIG. 2B during the stress operation according to an exemplary embodiment of the invention. FIG. 4B shows the configuration of data cells during the stress operation. Referring to FIG. 2A, FIG. 2B, FIG. 4A, and FIG. 4B, during the stress operation, the control module 130 controls the stressed data cell(s), e.g. the data cell N0, to be coupled to the high voltage $V_{DD}$, the low voltage $V_{SS}$, and the control voltage $V_G$ according to the distinguished results I0 to IN.

Specifically, taking the data cell N0 for example, the data cell N0 is a thin oxide NMOS of which the first end, the second end, and the control end are respectively the source end, the drain end, and the gate end. When the system is powered on, the program signal P0 delivered to the second latch unit 134-0 is high and is latched therein when the write enable signal WE is enabled before the stress voltage Vst goes to high. Next, the distinguished results I0 staying in the high level is outputted to the control unit 132-0, and accordingly, the control unit 132-0 changes the configuration of data cell N0, which is different from that during the normal operation. As shown in FIG. 4B, the source end of the data cell N0 is coupled to the low voltage $V_{SS}$, the drain end of the data cell N0 is coupled to the high voltage $V_{DD}$, and the control end of the data cell N0 is coupled to the control voltage $V_G$ during the stress operation, such that the control voltage $V_G$ reverses hot carriers of the data cell N0 for reducing stress time. In this case, the first ends and the second ends of other data cells N1 to Nn and Nref and the transistor Nref0 of the current sources 116 are coupled to the high voltage $V_{DD}$. In other words, the first ends and the second ends of the unstressed data cells N1 to Nn are coupled to the high voltage $V_{DD}$ and the control ends of the unstressed data cells N1 to Nn are coupled to the control voltage $V_G$ during the stress operation. In the present embodiment, the data cell N0 is exemplary, and other data cells N1 to Nn are similar thereto during the stress operation while stress is necessary.

In summary, the anti-fuse circuit in dual oxide process instead of the conventional high voltage process for saving manufacturing is provided in an exemplary embodiment of the invention. For the anti-fuse circuit of the invention, the high voltage process and high voltage pumping circuits are unnecessary, and hot carriers of the anti-fuse devices are reversed during the stress operation to reduce stress time.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An anti-fuse circuit, comprising:
   a programmable module coupled to a high voltage, a low voltage, and a control voltage and comprising a plurality of data cells, wherein each of the data cells has a first end, a second end, and a control end;
   a read module coupled to the programmable module, and during a normal operation, the read module distinguishing which one or more of the data cells are stressed; and
   a control module coupled to the programmable module, and during a stress operation, the control module controlling each stressed data cell to be coupled to the high voltage, the low voltage, and the control voltage,
   wherein the first end of each stressed data cell is coupled to the low voltage, the second end of the each stressed data cell is coupled to the high voltage, and the control end of the each stressed data cell is coupled to the control voltage during the stress operation.

2. The anti-fuse circuit as claimed in claim 1, wherein the first end and the second end of each unstressed data cell are coupled to the high voltage and the control end of each unstressed data cell is coupled to the control voltage during the stress operation.

3. The anti-fuse circuit as claimed in claim 1, wherein the programmable module further comprises:
   a first reverse unit coupled to the controls end of the data cells and providing the control voltage to the control end of each stressed data cell during the stress operation; and
   a second reverse unit coupled to the second ends of the data cells and providing the high voltage to the second end of each stressed data cell during the stress operation.

4. The anti-fuse circuit as claimed in claim 3, wherein the first reverse unit comprises:
   a first switch having a first end, a second end, and a control end, wherein the first end of the first switch is coupled to the control voltage, the second end of the first switch is coupled to the control ends of the data cells, and the control end of the first switch is coupled to an inverted stress voltage; and
   a second switch having a first end, a second end, and a control end, wherein the first end of the second switch is coupled to the second end of the first switch, and the second end and the control end of the second switch are coupled to the low voltage.

5. The anti-fuse circuit as claimed in claim 4, wherein the second reverse unit comprises:
   a third switch having a first end, a second end, and a control end, wherein the first end of the third switch is coupled to the second ends of the data cells, the second end of the third switch is coupled to the high voltage, and the control end of the third switch is coupled to the inverted stress voltage.

6. The anti-fuse circuit as claimed in claim 1, wherein the programmable module further comprises:
   a plurality of current sources controlled by a stress voltage, and each of the data cells being respectively biased by the current sources.

7. The anti-fuse circuit as claimed in claim 6, wherein the programmable module further comprises:
   a plurality of resistor sets respectively coupled between the data cells and the current sources, and each of the resistor sets comprising a plurality of resistors coupled in series.

8. The anti-fuse circuit as claimed in claim 7, wherein one of the data cells serves as a reference cell, the read module has a first input end and a plurality of input second ends, the first input end of the read module is coupled to the first end of the reference cell through the corresponding resistor set, the second input ends of the read module are respectively coupled to the first ends of the data cell except for the reference cell through the corresponding resistor sets, and a voltage of the first input end of the read module is higher than voltages of the second input ends of the read module.

9. The anti-fuse circuit as claimed in claim 8, wherein the read module comprises a plurality of first latch units, the read module distinguishes which one or more of the data cells are stressed according to a plurality of first selecting signals, and distinguished results are latched by the first latch units.

10. The anti-fuse circuit as claimed in claim 9, wherein the read module further comprises:
   a dummy switch having a first end and a second end, wherein the first end of the dummy switch serves as the first end of the read module and is coupled to the first end of the reference cell through the corresponding resistor set;
   a first selection unit having a plurality of first ends and a second end, wherein the first ends of the first selection unit serve as the second ends of the read module and are correspondingly coupled to the first ends of the data cells except for the reference cell through the corresponding resistor sets;
   a comparator having a first input end, a second input end, and an output end, wherein the first input end of the comparator is coupled to the second end of the dummy switch, and the second input end of the comparator is coupled to the second end of the first selection unit; and
   a second selection unit having a first end and a plurality of second ends, wherein the first end of the second selection unit is coupled to the output end of the comparator, the second ends of the second selection unit are coupled to the corresponding first latch units, and the first selection unit and the second selection unit select the data cells except for the reference cell to be distinguished according to the first selecting signals.

11. The anti-fuse circuit as claimed in claim 1, wherein the control module comprises a plurality of control units coupled to the first ends of the data cells.

12. The anti-fuse circuit as claimed in claim 11, wherein each of the control units corresponding to the one or more stressed data cells provides the low voltage to the first end of the one or more stressed data cells during the stress operation according to distinguished results of the read module.

13. The anti-fuse circuit as claimed in claim 12, wherein each of the control units corresponding to the one or more stressed data cells comprises:
   a fourth switch having a first end, a second end, and a control end, wherein the first end of the fourth switch is coupled to the high voltage, and the second end of the fourth switch is coupled to the first end of the corresponding data cell;
   a fifth switch having a first end, a second end, and a control end, wherein the first end of the fifth switch is coupled to the second end of the fourth switch, and the second end of the fifth switch is coupled to the low voltage;
   a NAND gate having a first input end, a second input end, and an output end, wherein the first input end of the NAND gate receives the distinguished results, the second input end of the NAND gate receives a stress voltage, and the output end of the NAND gate is coupled to the control end of the fourth switch; and
   a NOR gate having a first input end, a second input end, and an output end, wherein the first input end of the NOR gate receives the distinguished results, the second input end of the NOR gate receives an inverted stress voltage, and the output end of the NOR gate is coupled to the control end of the fifth switch.

14. The anti-fuse circuit as claimed in claim 11, wherein one of the data cells serves as a reference cell, the control unit corresponding to the reference cell comprises:
   a sixth switch having a first end, a second end, and a control end, wherein the first end of the sixth switch is coupled to the high voltage, the second end of the sixth switch is coupled to the first end of the reference cell, and the control end of the sixth switch is coupled to an inverted stress voltage; and
   a seventh switch having a first end, a second end, and a control end, wherein the first end of the seventh switch is coupled to the second end of the sixth switch, and the second end and the control end of the seventh switch are coupled to the low voltage.

15. The anti-fuse circuit as claimed in claim 11, wherein the control module further comprises:
   a plurality of second latch units coupled to the control units and latching distinguished results of the read module according to a second selecting signal.

16. The anti-fuse circuit as claimed in claim 1, wherein the control voltage is half of the high voltage.

17. The anti-fuse circuit as claimed in claim 1, wherein the data cells comprise anti-fuse devices.

* * * * *